United States Patent [19]
Zarabadi et al.

[11] Patent Number: 5,561,426
[45] Date of Patent: Oct. 1, 1996

[54] ANALOG-TO-DIGITAL CONVERTER

[75] Inventors: Seyed R. Zarabadi, Kokomo; Edward A. Komisarcik, Indianapolis, both of Ind.

[73] Assignee: Delco Electronics Corporation, Kokomo, Ind.

[21] Appl. No.: 311,999

[22] Filed: Sep. 26, 1994

[51] Int. Cl.$^6$ .............................. H03M 1/12; H03M 1/06
[52] U.S. Cl. ........................... 341/156; 341/118; 341/172
[58] Field of Search .................................... 341/156, 161, 341/172, 150, 155, 118

[56] References Cited

U.S. PATENT DOCUMENTS

| | | | |
|---|---|---|---|
| 4,194,187 | 3/1980 | Glendinning | 340/347 |
| 4,200,863 | 4/1980 | Hodges et al. | 340/347 AO |
| 4,366,439 | 12/1982 | Yamakido | 329/104 |
| 4,388,612 | 6/1983 | Takagi et al. | 340/347 |
| 4,907,002 | 3/1990 | Kawada | 341/172 |
| 4,918,449 | 4/1990 | Chin | 341/156 |
| 5,016,014 | 5/1991 | Bitting | 341/162 |
| 5,148,170 | 9/1992 | Leopold et al. | 341/157 |
| 5,416,485 | 5/1995 | Lee | 341/172 |

Primary Examiner—Jeffrey A. Gaffin
Assistant Examiner—Jason L. W. Kost
Attorney, Agent, or Firm—Jimmy L. Funke

[57] ABSTRACT

A converter for converting an analog signal into a digital representation having a most significant bit (MSB), upper-significant bits (USBs), and lower-significant bits (LSBs) with a least significant bit being a predetermined incremental voltage value. The converter is responsive to external signals and is adapted to receive a supply voltage. The analog-to-digital converter provides for a determination of the most significant bit (MSB) that does not rely on the ratio factor between the capacitors of the charge-storage capacitor bank nor on the accuracy of the ratio factor of the resistors of the voltage-scale resistive ladder network. Further, the converter comprises a charge-storage capacitor bank, a voltage-scale resistive ladder network, first and second comparators, an output stage amplifier, and an arrangement of electronically controlled switches and capacitors that cancel the DC offset conditions within the analog-to-digital converter in such a way that the DC offset conditions do not jeopardize the accuracy of the converter.

3 Claims, 3 Drawing Sheets

ANALOG-TO-DIGITAL CONVERTER

TECHNICAL FIELD

The present invention relates to an analog-to-digital converter, particularly suited for use in vehicles. More particularly, the present invention relates to an analog-to-digital converter that accepts an analog input from an analog multiplexer which, in turn, has inputs supplied from sensors that measure variables such as oxygen, pressure, position and temperature. Specifically, the present invention relates to an analog-to-digital converter that is substantially immuned to DC offset voltages, switch leakage current and other factors that commonly plague and degrade the performance of an analog-to-digital converter.

BACKGROUND OF THE INVENTION

Analog-to-digital converters are of an increasing importance, especially in the automotive field having a variety of variable functions, such as pressure and temperature, that are measured by associated sensors which commonly provide an analog signal output. The analog-to-digital converter accepts the analog signals and converts them to a corresponding digital representation which may be routed to an onboard computer.

Analog-to-digital converters are relatively sensitive devices that require certain precautions to be followed in order to provide proper operation thereof. Since the input signal is sampled, the analog-to-digital converter (which is a sampled-data system) should be adequately filtered to avoid aliasing which is a form of noise or interference in the circuit created, for example, by an applied signal which has high frequency components (frequency contents) that could result in a malfunction of the analog-to-digital converter. For example, an analog-to-digital converter having a ten-bit capacity with an input signal bandwidth of 1 KHz and a sampling frequency of 30 KHz, should have a signal applied thereto having no more than a −72.3 db signal level at the frequencies above 29 KHz. Further, the analog-to-digital converter should be supplied with a supply voltage that conforms to specified values with regard to the ripple/noise levels so as to also avoid conversion errors.

Analog-to-digital converters should also take into account conversion time and resolution accuracy. Conversion time is normally a system parameter that takes into account the requirements of the onboard computer to which the analog-to-digital converter interfaces, whereas, the resolution of the analog-to-digital converter should take into account at least five parameters given as follows: (1) gain accuracy, (2) DC offset features, (3) monotonicity, (4) differential linearity, and (5) integral linearity. Further, the performance of a sampled-data, analog-to-digital converter should take into account and preferably be immuned to device DC offset voltage, clock feedthrough, channel charge error, common-mode noise, and switch leakage current; all factors being known to those in the art.

SUMMARY OF THE INVENTION

It is, therefore, a principal object of the present invention to provide an analog-to-digital converter that is substantially immuned to device DC offset voltage, clock feedthrough, channel charge error, common-mode noise, and switch leakage current; as well as to provide an analog-to-digital converter having high gain accuracy, compensation for DC offset conditions, desired monotonicity, high differential linearity and high integral linearity.

Another object of the present invention is to provide an analog-to-digital converter comprising monolithic capacitors and resistors, each having an interrelated ratio matching factor that provides for good monotonicity, whereby the output of the analog-to-digital converter closely follows its input.

It is another object of the present invention to provide for an analog-to-digital converter having a ten-bit capability in which the most significant bit (MSB), serving as a sign for the applied input signal, is detected by a circuit arrangement comprising a plurality of resistors and capacitors and that is not susceptible to resistor or capacitor mismatches and is not dependent on device matching that commonly causes an inaccuracy in the MSB determination.

Other objects of the present invention, as well as advantages thereof over existing prior art forms, will be apparent in view of the following description accompanied by means hereinafter described and claimed.

In general, the converter of the present invention converts an analog signal, herein termed VIN, into a digital representation having a most-significant bit (MSB), upper-significant bits (USBs), lower-significant bits (LSBs), and with the lower significant bit (LSB) having a predetermined incremental voltage value. The converter is responsive to external control signals, such as herein termed "TSS1 and TSS2," and is adapted to have applied thereto a supply voltage, such as herein termed "VDA." The converter comprises capacitors and resistors, each preferably of the monolithic type, arranged so as to allow a relatively wide ratio matching factor, yet still providing for an accurate analog-to-digital conversion of the applied signal.

In one embodiment, the analog-to-digital converter comprises a charge-storing capacitor bank, a voltage-scale resistive ladder network, a plurality of electronic switches responsive to external signals, first and second comparators, an output amplifier and first, second, third, and fourth arrangements of different capacitors cooperating with different electronic switches so as to cancel DC offset conditions that would otherwise degrade the accuracy of the analog-to-digital converter. The charge-storage capacitor bank comprises a termination capacitor C1A and an array of capacitors of a number corresponding to the number of the upper significant bits (USBs) contained in the digital representation developed by the converter. The capacitors have values that are weighed to correspond to the binary significance between the upper significant bits (USBs). The termination capacitor C1A and each of the capacitors of the array have a first end connected together to form a first node (N1) and on which is present a quantity, herein termed "VX." The termination capacitor C1A and each of the capacitors of the array have a second end each of which second end is connected to one end of a respective electronic switch with each of which switch having its second end connected to form a second node (N2). The second end of the termination capacitor C1A and the second end of its respective electronic switch forms a third node (N3). Each of the capacitors of the array further has its second end connected to one end of a respective electronic switch with each of which electronic switch having its second end connected to a ground potential. The voltage-scale resistive ladder network comprises a plurality of resistors each with a predetermined value and all of which are defined by a number and arranged with the supply voltage VDA to provide the incremental voltage value of the least significant bit (LSB). The voltage-scale resistive ladder network is further arranged so that a first and second of the resistors respectively have one end connected to the supply voltage VDA and to the ground potential. Each of the first and second resistors has its other end connected to the remaining resistors. The remaining resistors are arranged in a string with each end of the remaining resistors being connected to one end of a respective electronic switch. The electronic switches have their other end connected together at the third node (N3). The string has a midpoint serving as a fourth node (N4) on which is present a quantity herein termed "VREF" and which serves as a reference voltage used in conversion of the applied signal VIN into its corresponding digital representation. One of the electronic switches responsive to the external signal TSS1 selectively connects the applied input signal VIN to the second node (N2). Another of the electronic switches, responsive to the external signal TSS1, selectively connects the first (N1) and fourth (N4) nodes together. A further electronic switch responsive to the external signal TSS1 selectively connects the VREF quantity to a first input of the first comparator E1 with the first input signal being herein termed the quantity VY. An electronic switch, responsive to the external signal TSS2, selectively connects the supply voltage VDA to the second node (N2). The first comparator E1 has a second input connected to the quantity VX and provides an output signal VOCOMP corresponding to the difference between the quantities VY and VX. The first arrangement of a capacitor CCH and two electronic switches have the first end of the capacitor CCH connected to the first input of the first comparator E1 and its second end connected to the first end of two related electronic switches, one of which electronic switch has its other end connected to the applied input signal VIN and the other of which electronic switch has its other end connected to ground potential. A second comparator E2 has first and second inputs and first and second outputs and which outputs are routed to and serve as feedback paths for the first comparator E1. The second arrangement has a capacitor CO1 having one end connected to ground potential and its other end connected to both of one end of a related electronic switch and to the first input of the second comparator E2. The related electronic switch for the capacitor CO1 has its other end connected to the output signal VOCOMP. A third arrangement has a capacitor CO2 having one end connected to a ground potential and its other end connected to both of one end of a related electronic switch and to the second input of the second comparator E2. The related electronic switch for the capacitor CO2 has its other end connected to the quantity VREF. An amplifier AV that has an electronic switch connected across its input and output develops an output signal DIN. A fourth arrangement has a capacitor COFF and a plurality of electronic switches. The capacitor COFF has a first end connected to the input of the amplifier AV and supplies a signal VCOFF2 thereto. The capacitor COFF has its other end connected to both of one end of each of the related plurality of electronic switches and receives a signal VCOFF1 thereat. One of the electronic switches related to the capacitor COFF has its other end connected to the quantity VREF and the other of the plurality of electronic switches has its other end connected to the signal VOCOMP.

DESCRIPTION OF EXEMPLARY EMBODIMENTS

Figure 1:
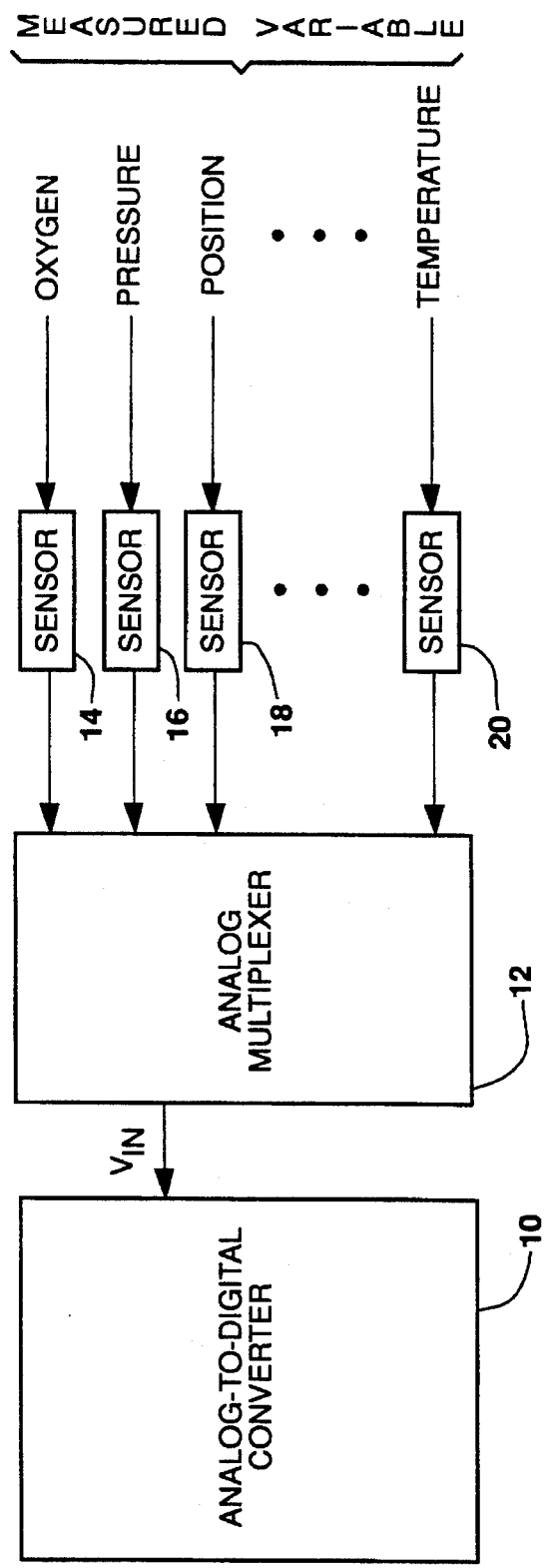
FIG. 1 is a block diagram showing the interconnections of the sampled-data, analog-to-digital converter of the present invention to an analog multiplexer which accepts the analog outputs from a plurality of sensors that measure variable quantities, such as oxygen and temperature.

Referring to the drawings, wherein like numbers designate like elements, there is shown in FIG. 1, a block diagram illustrating the interrelationship of the analog-to-digital converter 10 of the present invention with an analog multiplexer 12 having analog type sensor inputs 14, 16, 18 . . . 20, respectively measuring oxygen, pressure, position . . . temperature variables that are commonly found in an automobile environment.

The analog-to-digital converter 10 is a ten-bit device that provides digital equivalent codes corresponding to the analog values of the signal outputs of the oxygen sensor 14, the pressure sensor 16, the position sensor 18, and the temperature sensor 20. These sensor signals are delivered to the analog-to-digital converter 10 by means of a selective switching device, such as the analog multiplexer 12, which does not form part of the present invention, but should be able to provide an initial signal that settles to 99.9% of its final value in no longer than 4 microseconds. The clock frequency of the analog multiplexer 12 is typically approximately ten (10) times slower than that of the clock frequency serving the analog-to-digital converter 10. The analog-to-digital converter 10 of the present invention accommodates such an analog multiplexer 12 and may be further described with reference to FIGS. 2 and 3.

Figure 2:
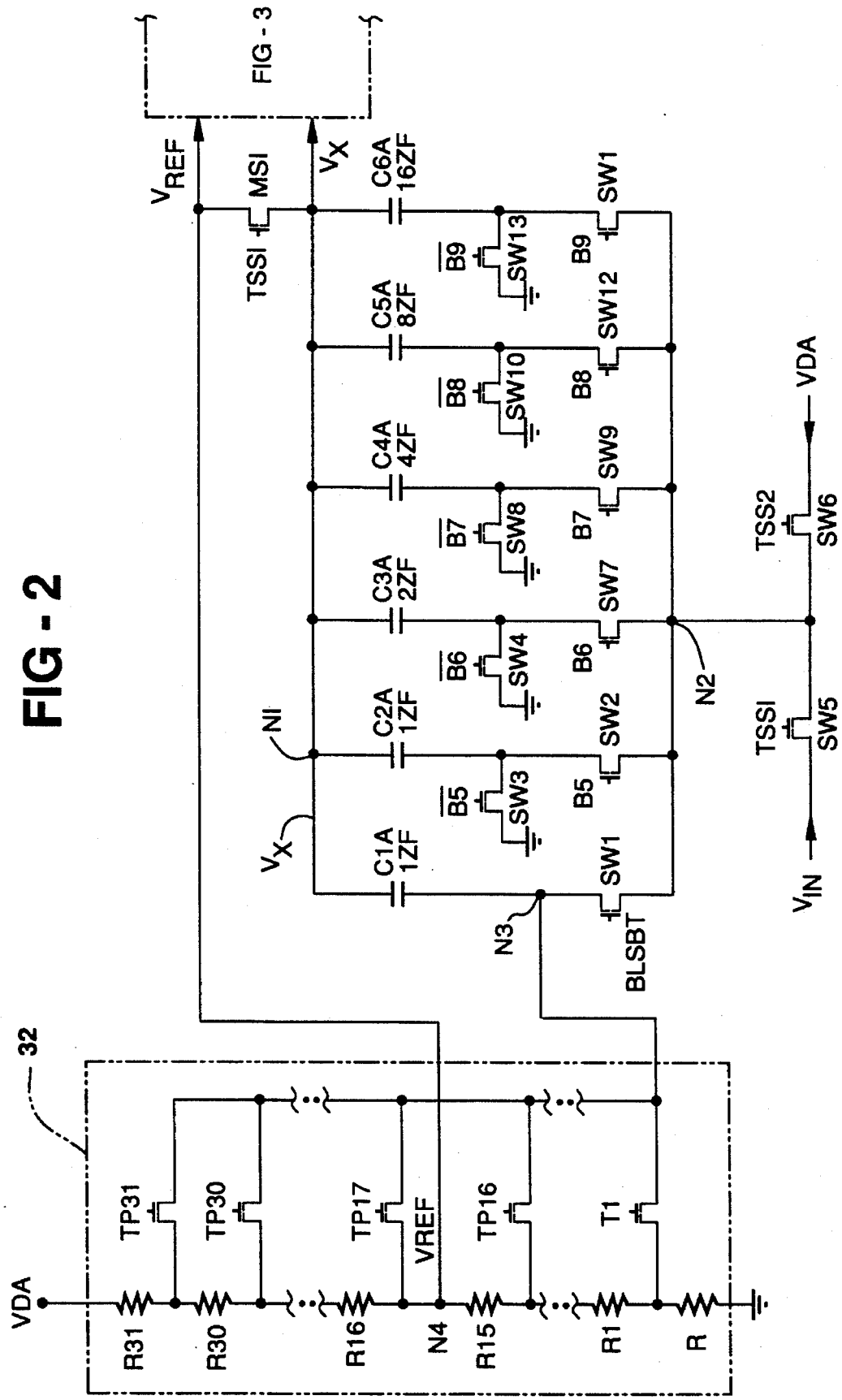
FIGS. 2 and 3 are simplified schematics of the sampled-data, analog-to-digital converter.
Figure 3:
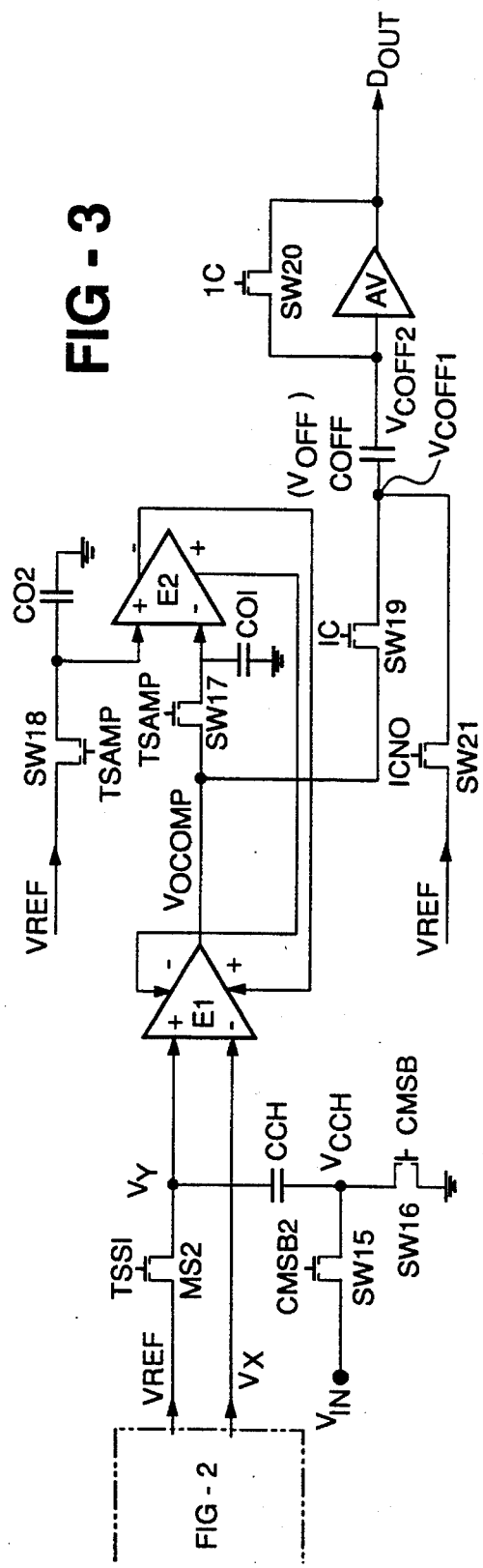

FIGS. 2 and 3 cumulatively illustrate a general schematic of an integrated circuit of the present invention comprising a charge-storing capacitor bank including a termination capacitor C1A (see FIG. 2) and an array of capacitors C2A, C3A, C4A, C5A and C6A, wherein the capacitors C2A . . . C6A preferably have proportionate values symbolized by the shown terminology 1ZF . . . 16ZF so that the value of capacitor C6A is sixteen (16) times greater than that of C2A. Since the maximum capacitor ratio is 1:16 (C2A:C6A), assuming high quality capacitors, it is possible to obtain 0.1% matching accuracy by practicing careful layout techniques (the best unit capacitor geometry and size, common centroid, match connectors, dummy layers to alleviate the fringing fields and other aspects of proper layout techniques known in the art).

As further seen in FIG. 2, the analog-to-digital converter 10 further comprises a voltage-scale resistive ladder network 12, arranged in a manner known in the art and including resistors R0–R31. The resistors R31 and R0, respectively have one end connected to a supply voltage herein termed "VDA" and to the ground potential. The resistors R31 and R0 may have each of their other end connected to the arrangement of remaining resistors R1–R30. The remaining resistors R1–R30 are arranged in a string with each end of the remaining resistors being connected to one end of a respective electronic switch as shown in FIG. 2 and as known in the art. It should be noted that resistors R1–R15 respectively cooperate with electronic switches T1–T16, whereas resistors R16–R31 respectively cooperate with electronic switches TP17–TP31. The string of resistors have a midpoint on which is present a quantity herein termed "VREF" and which serves, as will be described, as a reference voltage in the analog-to-digital conversions.

The voltage-scale resistive ladder network of FIG. 2 provides thirty-one (31) voltage increments preferably in a range from 0.15625 to 4.84375 volts in response to the resistors and their related electronic switches being consecutively controlled. Each voltage step of the resistive ladder network is typically 5V/32 which is equal to 156.25 mV. The voltage at a node (N3) increases or decreases by an incremental value of 156.25/32 mV. This voltage increment corresponds to the incremental voltage value of the least significant bit (LSB) of the analog-to-digital converter 10. As is known, this incremental voltage value may be altered by the selection of the number of resistors, each cooperating with a switch, employed in the resistive ladder network. Further, this value may be altered by the selection of the value of the supply voltage. Moreover, this value may be altered by an appropriate resistor tap. The resistors R0–R31 as well as the capacitors C1A, C2A, C3A, C4A, C5A, and C6A may be monolithic devices.

It is known that the values and thus the ratio between the monolithic capacitors C2A . . . C6A may be matched better than the ratio between the monolithic resistors R1–R32. This more accurate matching is achieved because the capacitor oxide thickness gradient between two capacitors laid out in close proximity is less than the diffusion or implantation nonuniformity of diffused or poly-silicon resistors. The result is that the ratio or matching accuracy between the values of the capacitors C1A . . . C6A is better matched than the ratio between the resistors R0–R31. On the basis of this fact, the charge-sharing capacitor bank and the voltage-scale resistive ladder network, were arranged to determine the upper five bits (USBs) and the lower five bits (LSBs), respectively, of the digital representation of the analog signal, herein termed "VIN," being converted by the analog-to-digital converter 10. This choice was made to minimize the nonlinearities in the transfer characteristics of the analog-to-digital converter 10. An alternative choice of using resistors for the USB's and capacitors for the LSB's would have assured monotonicity, however, the linearity would have been a direct function of resistor matching and, thus, suffer accordingly.

As will be further described, one of the novel features of the analog-to-digital converter 10 is that the determination of the most significant bit (MSB) of the analog signal being converted does not rely on any device matching accuracy. This provides for a ten (10) bit analog-to-digital converter needing only a nine (9) bit capacitor ratio accuracy capability. Since the resistors do not match as well as the capacitors, the resistors are used in the determination of the five least significant bits (LSBs) which requirement allows the resistors to exhibit only a 5 bit ratio accuracy.

As also will be discussed, another novel feature of the analog-to-digital converter 10 is that its operation cancels the DC offset of its comparators and its amplifier in such a way that it does not jeopardize the accuracy of the analog-to-digital converter by (unpredictable) switch channel charge injection and clock feedthrough.

The arrangement of the analog-to-digital converter 10 that obtains the above novel features may be further described with reference to FIGS. 2 and 3.

FIG. 2 illustrates the termination capacitor C1A and each of the capacitors C2A, C3A, C4A, C5A, and C6A as having a first end connected together and forming a first node (N1) and on which is present a quantity herein termed "VX." The capacitors C2A, C3A, C4A, C5A and C6A respectively serve the USB's bit 5, bit 6, bit 7, bit 8 and bit 9 and as will be described the termination capacitor C1A is a dividing element used in the determination of the LSB's bit 4, bit 3, bit 2, bit 1 and bit 0. The termination capacitor C1A and each of the other capacitors C2A . . . C6A have a second end each of which is connected to a respective electronic switch respectively shown as SW1, SW2, SW7, SW9, SW12, and SW14. Each of the switches SW1, SW2, SW7, SW9, SW12, and SW14 has its second end connected together to form a second node (N2). Each of the capacitors C2A, C3A, C4A, C5A, and C6A has its second end respectively connected to electronic switches SW3, SW4, SW8, SW10, and SW13 which, in turn, have their respective second end connected to a ground potential. As further seen in FIG. 2, the common bus shared by one end of the electronic switches T1 . . . TP31 is connected to the second end of the termination capacitor C1A and forms a third node (N3). Still further, as seen in FIG. 2, the quantity VREF is present on a fourth node (N4) which is formed by the connection between resistors R15 and R16.

As seen in both FIGS. 2 and 3, a plurality of electronic switches SWS, MS1 and MS2 are responsive to an applied external signal, herein termed "TSSi", and an electronic switch SW6 is responsive to a second applied external signal, herein termed "TSS2." Further, electronic switches SW15, SW16, SW17 and SW18, SW19, SW20 and SW21 are respectively responsive to external signals CMSB2, CMSB, TSAMP, IC and ICNO. The electronic switch SW5 selectively connects the applied signal VIN to the second node (N2), the electronic switch MS1 selectively connects the first node (N1) and fourth node (N4) together, and the electronic switch MS2 (see FIG. 2) connects the quantity VREF to a first input of a first comparator E1. The signal present on the first input to comparator E1 is herein termed the quantity "VY." The electronic switch SW6 selectively connects the supply voltage VDA to the second node (N2). The first comparator E1 has its second input connected to the herein termed quantity "VX" and provides an output signal VOCOMP that corresponds to the difference between the quantities VY and VX. The first input to the first comparator E1 has connected thereto a first arrangement comprising a capacitor CCH, storing a voltage VCCH, and two electronic switches SW15 and SW16.

The capacitor CCH has its first end connected to the first input of the first comparator E1 and has its second end connected to a first end of each of the electronic switches SW15 and SW16. The electronic switch SW15 has its other end connected to the input signal VIN, whereas the electronic switch SW16 has its other end connected to the ground potential.

The second comparator E2, as shown in FIG. 3, has first and second inputs and first and second outputs which outputs are routed to and serve as feedback paths for the first comparator E1. The polarities of the interconnections between the comparators E1 and E2, as well as the polarities at the input stages of the comparators E1 and E2, are as shown in FIG. 3. The first input of the second comparator E2 has connected thereto a second arrangement comprising a capacitor CO1 and an electronic switch SW17. The capacitor CO1 has one end connected to the ground potential and its other end connected to both of one end of the electronic switch SW17 and to the first input of the second comparator E2. The electronic switch SW17 has its other end connected to the output signal VOCOMP.

The second input of the second comparator E2 has connected thereto a third arrangement comprising a capacitor CO2 and an electronic switch SW18. The capacitor CO2 has one end connected to the ground potential and its other end connected to both of one end of the electronic switch SW18 and to the second input of the second comparator E2. The electronic switch has its other end connected to the quantity VREF.

An amplifier AV, as seen in FIG. 3, has an electronic switch SW20 connected across its input and its output. The amplifier AV develops an output signal Dout which is also the output of the analog-to-digital converter 10. The input of the amplifier AV is connected to a fourth arrangement comprising a capacitor COFF, and electronic switches SW19 and SW21.

The capacitor COFF has its first end connected to the input of the amplifier AV and supplies a signal VCOFF2 thereto. The capacitor COFF has its other end connected to both of one end of each of the electronic switches SW19 and SW21, and receives a signal VCOFF1 thereat. The electronic switch SW21 has its other end connected to the quantity VREF, whereas the electronic switch SW19 has its other end connected to the signal VOCOMP.

OPERATION OF THE ANALOG-TO-DIGITAL CONVERTER 10

The operation of the analog-to-digital converter 10 involves three basic activities which are as follows: sampling the input signal VIN, cancelling the offset of the gain stages related to the first and second comparators E1 and E2 and the amplifier AV (all of which devices are in the signal path), and the making of a particular bit decision. The analog-to-digital converter 10 performs two operations simultaneously before it starts making any bit decisions. The two simultaneous operations are the sampling of the input signal VIN and the measuring of the DC offset of the comparators E1 and E2, and the clock feedthrough components of the switches in the signal path. The term "signal path" is meant to include all of the paths that an analog signal, such as VIN, applied to the input of the analog-to-digital converter 10 encounters before it emerges therefrom as a digital representation segmented into its MSB, USB and LSB components. The sampling process involved for VIN begins by turning on switches SW1, SW2, SWS, SW7, SW9, SW12, SW14, SW16, and MS1. The voltage difference between the quantities VIN and VREF is stored across capacitors C1A, C2A, C3A, C4A, C5A, and C6A.

Since the voltage-scale resistive ladder network is not used during the sampling period, the MOS transistors T1–T16 and TP17–TP31 (see FIG. 2) are off. Electronic switches MS2, SW17, SW18, SW19, and SW20 are turned on to offset-cancel the comparators E1, E2, and the amplifier AV gain stage. The capacitor COFF stores the high gain threshold point of the amplifier AV gain stage. The DC offset voltage due to the differential stages of both comparators E1 and E2 are stored on the capacitors CO1 and CO2. The offset-cancelling begins by storing VREF on capacitor CCH because the electronic switch SW16 is rendered conductive at this time. (At this point, it should be noted that VX=VY= VREF). The comparators E1 and E2 are configured, as shown in FIG. 3, as a unity gain follower and the output of comparator E1 (VOCOMP) is forced to be equal to the expression VREF +/–VOFF, wherein VOFF is the voltage across the capacitor COFF. Since the inputs to the comparator E1 are equivalent (shorted), any DC offset voltages of the comparators E1 and E2 (caused by device mismatch) are stored on capacitor CO1.

Another way to explain the offset-cancellation process of the present invention is that since VX=VY; VOCOMP more than likely will be sitting midway between the supply voltage VDA and ground (basically VREF and thus properly compensated). However, it has been determined that offsets will cause this voltage VOCOMP to be a little different than VREF. Since there is unity gain feedback around comparators E1 and E2, (and the positive input of comparator E2 is shorted to VREF at this time) the negative input to comparator E2 is forced to become the difference between VREF and the total DC offset in the analog-to-digital converter 10 (DC offset of the comparators E1 and E2, clock feedthrough of switches SW17, SW18, and MS2 and MS1). The capacitor COFF stores the DC voltage difference between the high gain point of gain stage of amplifier AV and offset voltage present at VOCOMP. Also, the channel charge and clock feed-through voltages of switches MS1–MS2 and SW17–SW18 become common-mode signals which are stored in capacitors C1A–C6A, CCH, and CO1–CO2, respectively. An important contribution provided by the arrangement shown in FIGS. 2 and 3 is that the DC offset voltages of comparators E1 and E2 is, to the first order, cancelled with no additional error due to channel charge and clock feedthrough of the switches. This cancellation assures proper operation. More particularly, the operation of the present invention provides a method of offset cancelling which ensures that the comparator E1 is operating at a maximum sensitivity to differential input voltage (VY–VX).

It should now be emphasized that the present invention cancels the DC offset of the comparator E1, as well as that of comparator E2 and amplifier AV, in such a way that it does not jeopardize the accuracy of the converter. Further, it should be emphasized that the number of arrangements comprising capacitors and electronic switches could be reduced if the analog-to-digital converter operated with only comparator E1, although its performance would be degraded.

The operation to determine the most significant bit (MSB) causes the switches MS1, MS2, SW5, SW16, SW17, SW18, SW19 and SW20 to be turned off, while switches SW6, SW15 and SW21 are turned on. At this point, the expression for the voltages (VX and VY) at the input to the comparator E1 is given by the below relationship 1 and 2:

$$VX = VDA - VIN + VREF$$

$$VY = VIN + VREF$$

Note that the quantity VREF, a common-mode reference signal, appears as a common-mode DC signal used to properly bias the differential stages of the comparator E1. The quantity VDA is the reference voltage applied to the analog-to-digital converter 10 and is chosen to be a positive supply voltage, because the full scale input signal was defined to have a value that corresponds to VDA. Note that only the quantities VX and VY are used to determine the most significant bit (MSB). Further note that the DC offset voltages of the differential stages of comparators E1 and E2 have already been stored in the capacitors CO1 and CO2. As long as the overall gain factor of the analog-to-digital converter 10 (primarily determined by the combined operation of comparators E1 and E2 and amplifier AV) is at least 1024, the most significant bit (MSB) can be correctly determined with no first order dependency on device ratio matching. More particularly, the most significant bit (MSB) determination is not dependent upon any ratio matching of the values between capacitors C2A . . . C6A nor on the ratio matching between resistors R0 . . . R31. If the output condition representative by the output signal Dout indicates that the most significant bit (MSB) is a 1, then electronic switch SW14 is left on. Otherwise, electronic switch SW14 is turned off and electronic switch SW13 is turned on. The quantity Dout data value is stored in an appropriate latch (not shown in FIG. 3) before the next bit is evaluated. Therefore, the MSB is strictly determined by the voltage difference VX–VY and the gain from the inputs to the comparator E1 to the output Dout. The absolute accuracy of the reference voltage, also referred to the quantity VREF, is not important since VREF appears as a common mode signal.

After the most significant bit (MSB) is determined, the voltage VCCH present across capacitor CCH is level shifted back down to an amount equal to the applied signal VIN by the operation of the electronic switch SW15. Bits 8 through 5 (USBs) are evaluated (since the analog-to-digital converter determines its bits in descending order) by following the procedure as follows: offset cancel the comparators (E1 and E2) and output gain stage (amplifier AV), (as previously discussed), short the bit to be evaluated (actually a capacitor, see FIG. 2, e.g., capacitor C5A for bit 8) to ground, bias the output stage (amplifier AV) so it is in its high gain region, transfer VOCOMP to the input VCOFF1 by the operation of SW19, level shift off VREF, and then the quantity VCOFF2 will be of a sufficient value to toggle or change the state of Dout. If the bit=0, the capacitor (e.g., C5A) stays grounded during the next bit (e.g., bit 7) evaluation. For example, if capacitor C5A shorted by the switch SW10 was grounded and bit B8 was 0, then the capacitor C5A remains shorted while bit 7 is evaluated. By turning on switch SW8 and turning off SW9, the next bit (bit 7) can be determined. Again, if the value of the Dout indicates that the USB (bit 7) is 1, then switch SW9 is turned on and switch SW8 is turned off. The bit decision is stored in the latch before the next bit is determined. The USBs are sequentially found according to the described above procedure. It must be noted that before each bit decision is made, the gain stage (amplifier AV) stores its threshold voltage on the capacitor COFF. This storing ensures efficient operation of this gain stage (amplifier AV) during the bit decision time, even in the presence of switching/substrate noise.

The lower five-bits (LSBs) are found by turning off switch SW1 and turning on T16 (see FIG. 2), while the present switch positions of the upper five-bits (USBs) stay intact. More particularly, the status of the capacitors C2A–C6A respectively serving bits 9–5 remain the same. Before bits 4 through 0 are evaluated, the signal BLSBT is set equal to 0. With BLSBT function disabled, capacitor C1A will capacitively divide down the voltage VREF provided by the voltage-scale resistive ladder network. The dividing of the quantity may be accomplished in thirty-two (32) incremental steps by the operation of the voltage-scale resistive ladder network in a manner known in the art. Bits 4 through 0 comprising the least significant bits (LSBs) are evaluated by the procedure given as follows: force (set bit=1) the bit being evaluated to that of VDA, the decoder (not shown in FIG. 3) then connects a voltage tap from the voltage-scale resistive ladder network present at the third node (N3) to one side of the capacitor C1A, capacitor C1A capacitively divides the voltage level shift to the quantity VX present on the first node (N1), bias the gain stage (amplifier AV) so that it is in the respective high gain region, and then let the analog-to-digital converter 10 make the bit determination. If the fourth bit, that is the first bit determined by the dividing action of capacitor C1A, is a 1, it is then stored in a latch (not shown) and T16 turns off and TP24 (indicated in phantom in FIG. 2) turns on to find the next or third bit determined by the dividing action of capacitor C1A. If the fourth bit was found to be 0, after storing the contents of Dout, T16 is turned off and T8 (indicated in phantom in FIG. 2) is turned on to find the next or third bit determined by the dividing action of capacitor C1A. This successive approximation algorithm proceeds until the final bit (bit 0) is found. At this point, the voltage VX–VY present at the input to the comparator E1 is reduced to less than or equal to the voltage incremental quantity of the least significant bit (LSB). It should be noted that any charge stored for the quantity VX is discharged to its original value represented by the quantity VREF. This indicates that the parasitic capacitance at the first node (N1) has minimal effect on the performance of the analog-to-digital converter 10. Because of the pseudo-differential configuration of the analog-to-digital converter 10, this converter is, to the first order, immune to substrate noise injection. The ideal expressions for the quantities VX and VY are summarized below:

For MSB (b9)

$VX=VDA-VIN+VREF$ $VY=VIN+VREF$

For b0–b8

$VX=VREF-VIN+VDA(b9/2+b8/4+b7/8+b6/16+b5/32+b4/64+b3/128+b2/256+b1/512+b0/1024)$  $VY=VREF$

Clock feedthrough is a major concern of error that affects the performance of the analog-to-digital converter 10. The feedthrough from switches connected to the voltage-scale resistive ladder network, input signal and reference signal may be totally eliminated, or at least greatly reduced, by introducing appropriate delays in the nonoverlapped clock signals.

The digital-to-analog conversion inherent in the operation of the analog-to-digital converter 10 is of importance. The digital-to-analog converter's response to a 10-bit digital code involves the interaction between the voltage-scale resistive ladder network 12 and the capacitor array comprising C2A, C3A, C4A, C5A, and C6A. As the 10-bit code passes through the first 32 voltage increments (caused by the electronic switches of the voltage-scale resistive ladder network), the resistors of the voltage-scale resistive ladder network are consecutively switched from 0.15625 volts to 4.84375 volts. Each voltage step of the resistor is a value of 5V/32=156.25 mV. The voltage present at the first node (N1) experiences a delta change of 156.25/32 mV. Before the voltage VX becomes equal to a value of 156.25 mV (when the electronic switch TP31 is rendered on), a capacitor in the array is switched to the reference voltage (VREF) and the voltage-scale resistive ladder network repeats the same process by turning on T1 and turning off TP31. Switching one or more appropriate capacitors to the reference supply (VDA) and going through the resistive taps results in a ramp output signal with a maximum amplitude equal to the reference voltage for the digital code of 1111111111.

It should now be emphasized that the practice of the present invention provides for an analog-to-digital converter having an arrangement and an operation that is immune to device offset voltage, clock feedthrough, channel charged error, common-mode noise and switch leakage current. Further, the analog-to-digital converter provides for a determination of the most significant bit (MSB) that is not dependent upon the accuracy of the ratio between either of the monolithic capacitors C2A ... C6A nor any of the ratio of the monolithic resistors R0–R31.

Figure 4:
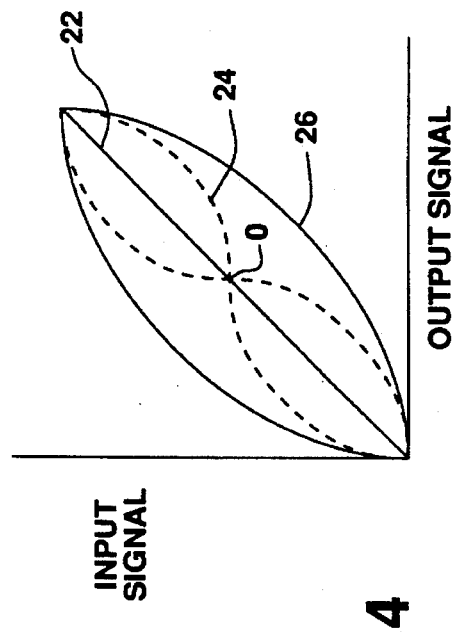
FIG. 4 illustrates a plurality of plots that compare the integral linearity of the analog-to-digital converter of present invention to that of a conventional analog-to-digital converter.

As previously discussed, the most significant bit (MSB) of the analog-to-digital converter is precisely found, and therefore, the integral nonlinearity (INL) at the midpoint of its transfer curve, shown in FIG. 4 as plot 22, is 0. As further seen in FIG. 4, the dashed curves 24 represent the INL curve of the present analog-to-digital converter 10 as compared to those of a conventional converter shown by the solid curves 26.

Figure 5:
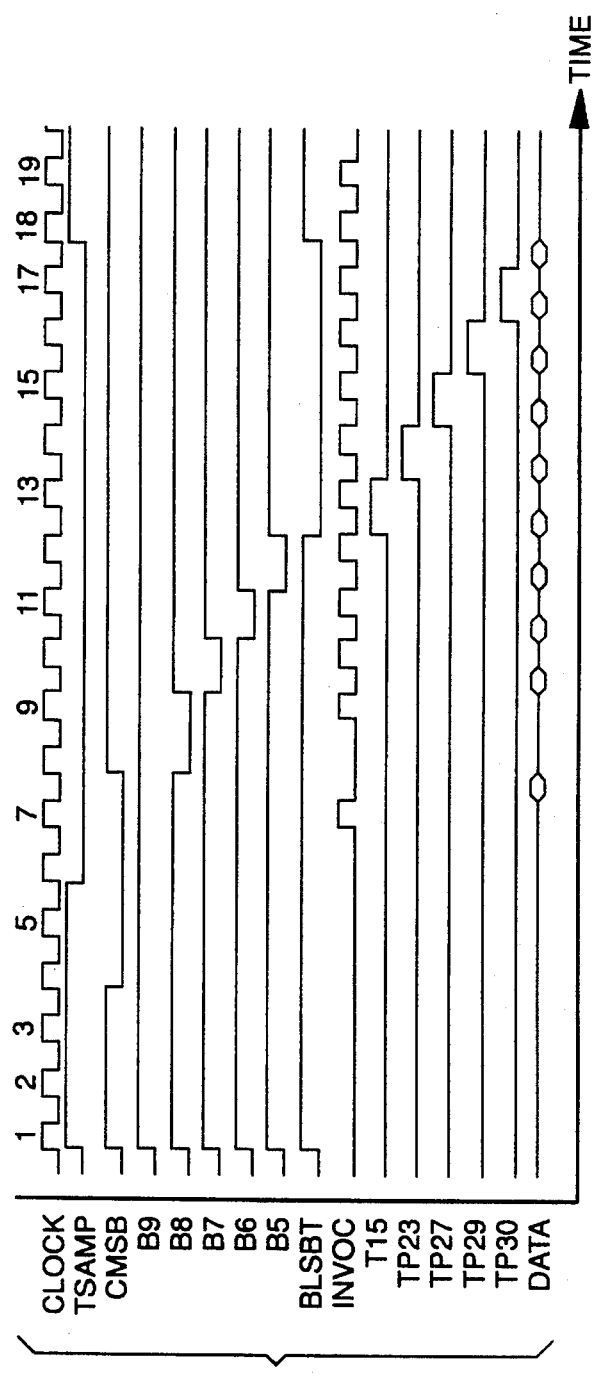
FIG. 5 illustrates some of the waveforms associated with the operation of the analog-to-digital converter of FIGS. 2 and 3.

The operation of the present invention is illustrated, in part, by the timing diagram of FIG. 5. From FIG. 5 it should be noted that the function BLSBT is present during bits B9, B8, B7, B6, B5 and absent during bits B4, B3, B2, B1, B0 respectively shown as timing terms T15, TP23, TP27, TP29 and TP30.

It should now be emphasized that the practice of the present invention provides for an analog-to-digital converter having a relatively high differential linearity and a relatively high integral linearity.

It should be further appreciated that although the hereinbefore given description of the analog-to-digital converter has been primarily described for vehicles' applications, it should also be recognized that the principles of the present invention teach the use of the analog-to-digital converter with all types of measuring systems, including those that may be used for various domestic, commercial or industrial applications.

The embodiments of the invention in which an exclusive property or privilege is claimed are defined as follows:

1. A converter for converting an analog signal (VIN) into a digital representation having a most-significant bit (MSB), upper significant bits (USBs), lower-significant bits (LSBs) and a lowest-significant bit (LSB) where the lowest-significant bit (LSB) has a predetermined incremental voltage value, said converter being responsive to a first external signal (TSSi) and a second external signal (TSS2) and adapted to have applied thereto a supply voltage (VDA), said converter comprising:

(a) a charge-storing capacitor bank comprising a termination capacitor (C1A) and an array of capacitors consisting of a number corresponding to the number of said upper-significant bits, each of the capacitors in the array of capacitors having a value that is weighed to correspond to the binary significance of said upper-significant bits, said termination capacitor (C1A) and each of said capacitors of said array having a first end connected to form a first node (N1) and on which is present a first quantity (VX), said termination capacitor (C1A) and each of said capacitors of said array having a second end each of which second end is connected to one end of a respective electronic switch of a first set of electronic switches where each electronic switch has its second end connected together to form a second node (N2), said second end of the termination capacitor (C1A) and said first end of its said respective electronic switch forming a third node (N3), each of said capacitors of said array further having its second end connected to a first end of a respective electronic switch of a second set of electronic switches where each switch of the second set of switches has its second end connected to a ground potential, said second set of switches being a different set of switches than said first set of switches;

(b) a voltage-scale resistive ladder network comprising a plurality of resistors each having a predetermined value and being of a number and arranged with said supply voltage (VDA) so as to produce said incremental voltage value of said least-significant bit, said voltage-scale resistive ladder being further arranged so that one of said resistors has one end connected to said supply voltage (VDA) and another of said resistors has one end connected to said ground potential, said one and another of the resistors having its other end connected to the remaining resistors in the ladder network, said remaining resistors being arranged in a string with each of said remaining resistors being connected to one end of a respective electronic switch of a third set of electronic switches where each switch of the third set of switches has its other end connected together at said third node (N3), said string of resistors having a midpoint serving as a fourth node (N4) on which is present a second quantity (VREF);

(c) a fourth set of electronic switches responsive to said first external signal (TSS1), one of said electronic switches of the fourth set of switches selectively connecting said input signal (VIN) to said second node (N2), another one of said electronic switches of the fourth set of switches selectively connecting said first node (N1) and said fourth node (N4) together, and a further one of said electronic switches of the fourth set of switches selectively connecting said second quantity (VREF) to an input (VY) of a comparator (E1);

(d) at least one electronic switch responsive to said second external signal (TSS2) for selectively connecting the supply voltage (VDA) to said second node (N2);

(e) said comparator (E1) having a second input connected to said first quantity (VX), said comparator (E1) providing an output signal (VOCOMP) corresponding to the difference between said first quantity (VX) and the first input (VY); and (f) a capacitor (CCH) and first and second electronic switches, said capacitor (CCH) having a first end connected to said first input of said comparator (E1) and a second end connected to a first end of each of the first and second electronic switches, wherein one of the first and second electronic switches has its other end connected to said input signal (VIN) and the other of which is connected to said ground potential.

2. The converter according to claim 1, wherein said capacitors and said resistors are monolithic devices, said capacitors having a ratio matching factor of about 0.2% or better and said resistors having a ratio matching factor of about 3% or better.

3. A converter for converting an analog signal (VIN) into a digital representation having a most-significant bit (MSB), upper-significant bits (USBs), lower-significant bits (LSBs) and a lowest-significant bit (LSB) where the lowest-significant bit (LSB) has a predetermined incremental voltage value, said converter being responsive to a first external signal (TSS1) and a second external signal (TSS2) and adapted to having applied thereto a supply voltage (VDA), said converter comprising:

(a) a charge-storing capacitor bank comprising a termination capacitor (C1A) and an array of capacitors consisting of a number corresponding to the number of said upper-significant bits, wherein each of the capacitors of the array has a value that is weighed to correspond to the binary significance of said upper-significant bits, said termination capacitor (C1A) and each of said capacitors of said array having a first end connected to form a first node (N1) and on which is present a first quantity (VX), said termination capacitor (C1A)

and each of said capacitors of said array having a second end each of which second end is connected to one end of a respective electronic switch of a first set of electronic switches where each electronic switch has its second end connected together to form a second node (N2), said second end of termination capacitor (C1A) and said first end of its said respective electronic switch forming a third node (N3), each of said capacitors of said array further having its second end connected to one end of a respective electronic switch of a second set of electronic switches where each switch of the second set of switches has its second end connected to a ground potential;

(b) a voltage-scale resistive ladder network comprising a plurality of resistors each having a predetermined value and being of a number and arranged with said supply voltage (VDA) so as to produce said incremental voltage value of said least-significant bit, said voltage-scale resistive ladder being further arranged so that one of said resistors has one end connected to said supply voltage (VDA) and another of said resistors has one end connected to said ground potential, said one and another of the resistors having its other end connected to the remaining resistors in the ladder network, said remaining resistors being arranged in a string with each of said remaining resistors being connected to one end of a respective electronic switch of a third set of electronic switches where each of the third set of switches has its other end connected together at said third node (N3), said string having a midpoint serving as a fourth node (N4) on which is present a second quantity (VREF);

(c) a plurality of electronic switches responsive to said first external signal (TSS1), one of said electronic switches selectively connecting said input signal (VIN) to said second node (N2), another one of said electronic switches selectively connecting said first node (N1) and fourth node (N4) together, and a further one of said electronic switches selectively connecting said second quantity (VREF) to a first input (VY) of a first comparator (E1);

(d) at least one electronic switch responsive to said second external signal (TSS2) for selectively connecting the supply voltage (VDA) to said second node (N2);

(e) said first comparator (E1) having a second input connected to said first quantity (VX), said first comparator (E1) providing an output signal (VOCOMP) corresponding to the difference between said first quantity (VX) and the first input (VY);

(f) a first arrangement of a first capacitor (CCH) and first and second electronic switches, said first capacitor (CCH) having a first end connected to said first input of said first comparator (E1) and a second end connected to a first end of each of said first and second electronic switches one of the first and second electronic switches has its other end connected to said input signal (VIN) and the other of which is connected to said ground potential;

(g) a second comparator (E2) having first and second inputs and first and second outputs which outputs are routed to and serve as feedback paths for said first comparator (E1);

(h) a second arrangement of a second capacitor (CO1) and a third electronic switch, said second capacitor (CO1) having one end connected to said ground potential and its other end connected to both of one end of said third electronic switch and said first input of said second comparator (E2), said third electronic switch having its other end connected to said output signal (VOCOMP);

(i) a third arrangement of a third capacitor (CO2) and a fourth electronic switch, said third capacitor (CO2) having one end connected to said ground potential and its other end connected to both of one end of said fourth electronic switch and said second input of said second comparator (E2), said fourth electronic switch having its other end connected to said second quantity (VREF);

(j) an amplifier (AV) that has a fifth electronic switch connected across its input and output and that develops an output signal (DOUT); and (k) a fourth arrangement of a fourth capacitor (COFF) and a plurality of electronic switches, said fourth capacitor (COFF) having a first end connected to said input of said amplifier (AV) and supplying a signal (VCOFF2) thereto, said fourth capacitor (COFF) having its other end connected to both of one end of each of said plurality of electronic switches and receiving a signal (VCOFF1) thereat, one of said plurality of electronic switches having its other end connected to said second quantity (VREF) and another of said plurality of electronic switches having its other end connected to said output signal (VOCOMP).

* * * * *